(12) United States Patent
Saitoh

(10) Patent No.: US 6,495,758 B2
(45) Date of Patent: Dec. 17, 2002

(54) ANISOTROPICALLY ELECTROCONDUCTIVE CONNECTING MATERIAL

(75) Inventor: Masao Saitoh, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/800,718

(22) Filed: Mar. 8, 2001

(65) Prior Publication Data
US 2001/0030019 A1 Oct. 18, 2001

(30) Foreign Application Priority Data

Mar. 15, 2000 (JP) ........................................ 2000-073026
Mar. 30, 2000 (JP) ........................................ 2000-094015

(51) Int. Cl.$^7$ ........................... H01R 4/00; G02F 1/1345
(52) U.S. Cl. ...................... 174/94 R; 174/259; 349/150
(58) Field of Search ........................ 174/94 R, 117 A, 174/256, 257, 259; 349/150

(56) References Cited

U.S. PATENT DOCUMENTS 6,184,577 B1 * 2/2001 Takemura et al. .......... 257/701
2001/0046021 A1 * 11/2001 Kozuka et al. ............. 349/150

* cited by examiner

Primary Examiner—Chau N. Nguyen
(74) Attorney, Agent, or Firm—Oliff & Berridge, PLC

(57) ABSTRACT

An anisotropically electroconductive connecting material, which is disposed between a connection terminal on a first substrate and a connection terminal on a second substrate and joins the substrates together by thermocompression bonding while maintaining electroconductive connection therebetween, includes electroconductive particles dispersed in an insulating adhesive, wherein the modulus of elasticity of the electroconductive particles at the compression bonding temperature is 200% or less of the modulus of elasticity of the first substrate at the compression bonding temperature.

10 Claims, 1 Drawing Sheet

ANISOTROPICALLY ELECTROCONDUCTIVE CONNECTING MATERIAL

BACKGROUND OF THE INVENTION

1. Field of the Invention

The present invention relates to an anisotropically electroconductive connecting material which is suited to the manufacture of liquid crystal panels which use plastic substrates.

2. Description of the Related Art

Liquid crystal panels which use liquid crystal cells, in which a liquid crystal is sealed between a pair of transparent glass substrates, have been used in electronic devices such as mobile telephones and laptop computers, which have been enjoying widespread use.

These liquid crystal panels are produced by sandwiching an anisotropically electroconductive connecting material having electroconductive particles dispersed in a thermosetting insulating adhesive, between indium-tin-oxide (ITO) electrodes on a glass substrate of a liquid crystal cell and connection terminals on a flexible substrate, then thermocompression bonding the assembly to effect mutual adhesion therebetween while maintaining the electroconductive connection therebetween.

Recent attempts to make these liquid crystal panels lighter and thinner have involved substituting transparent glass substrates of the liquid crystal cell with transparent plastic substrates such as polycarbonate substrates, polyether sulfone substrates, which transparent plastic substrates are lighter and stronger than the transparent glass substrates.

However, these plastic substrates have a softening point at 100 to 220° C., unlike glass substrates, and this softening point overlaps the compression bonding temperature range. Accordingly, stresses build up on the ITO electrodes which contact the electroconductive particles during compression bonding, so that, the portion of the plastic substrate affected suffers deformation and cracks appear in the ITO electrodes, resulting in a poor display. This drawback is particularly evident when the electroconductive particles used can enable good connection reliability in case of manufacturing liquid crystal panels which use glass substrates (i.e., electroconductive particles which have a high modulus of elasticity and which do not soften during compression bonding).

Measures used to counteract this problem have involved using electroconductive particles comprising a resin core on the surface of which a metal layer has been formed, which resin core deforms under relatively light loads. However, due to the fact that the electroconductive particles suffer plastic deformation, heat, external stresses, humidity and other factors cause the dimensions of the connection portions to change, and the particles cannot follow these changes in such cases; post-ageing connection reliability suffers an especially marked deterioration.

The drawbacks described above occur not only during the manufacture of liquid crystal panels, but also when substrates are used which deform readily under thermocompression bonding conditions in case of establishing anisotropically electroconductive connections, and also in case of using electroconductive particles which are plastically deformable.

SUMMARY OF THE INVENTION

With the foregoing problems of the prior art in view, it is an object of the present invention to provide an anisotropically electroconductive connecting material which allows the ITO electrodes not to crack, or the post-ageing connection reliability not to deteriorate, when establishing anisotropically electroconductive connections between mutually opposing substrates, even when a plastic substrate on which ITO electrodes have been furnished is used as the substrate, The present inventors perfected the present invention by discovering (1) that by keeping the modulus of elasticity at the compression bonding temperature of the electroconductive particles used in the anisotropically electroconductive connecting material at a pregiven value or less than the modulus of elasticity at the compression bonding temperature of the substrate to be connected, even when a plastic substrate on which ITO electrodes have been furnished is used as the substrate, it is possible to avert any cracking in the ITO electrodes; and moreover (2) when the modulus of elasticity within the normal temperature range (e.g., 25° C.) of the electroconductive particles is raised higher than the modulus of elasticity of same at the compression bonding temperature, then post-ageing connection reliability can be enhanced.

In other words, the present invention is an anisotropically electroconductive connecting material, which is provided in order to avert any cracking in ITO electrodes when a plastic substrate on which ITO electrodes have been furnished is used as the substrate, which is disposed between connection terminals on a first substrate and connection terminals on a second substrate, and joins the substrates together by means of thermocompression bonding while maintaining the electroconductive connection therebetween, and which comprises electroconductive particles have been dispersed in an insulating adhesive, wherein the modulus of elasticity of the electroconductive particles at the compression bonding temperature is 200% or less of the modulus of elasticity of the first substrate at the compression bonding temperature.

It is preferable for the modulus of elasticity of the electroconductive particles at the compression bonding temperature to be 60 to 90% of the modulus of elasticity of same at 25° C., in order to further impart properties which can enhance the post-ageing connection reliability in the aniostropically electroconductive connecting material.

BRIEF DESCRIPTION OF THE DRAWINGS

Various exemplary embodiments of this invention will be described in detail, with reference to the following FIGURE, wherein.

DESCRIPTION OF PREFERRED EMBODIMENTS

Figure 1:
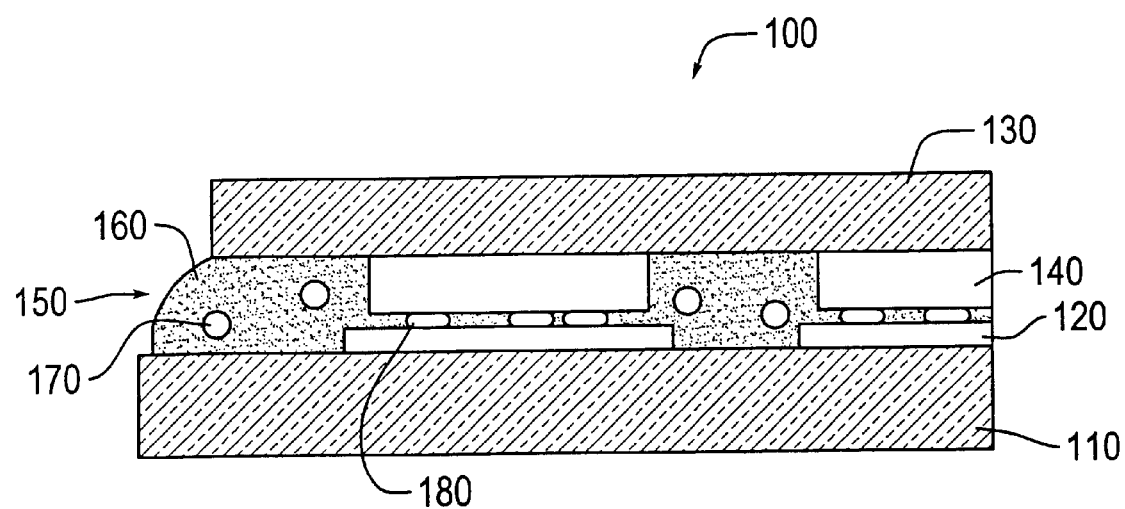
FIG. 1 is a cross-sectional diagram of a connection structure having anisotropically electroconductive connecting material in accordance with the various embodiments of the present invention.

FIG. 1 is a cross-sectional diagram of a connection structure 100 having anisotropically electroconductive connecting material 150 in accordance with the various embodiments of the present invention.

In FIG. 1, the anisotropically electroconductive connecting material 150 is a material that is disposed between a connection terminal 120 on a first substrate 110 and a connection terminal 140 of a second substrate 130, and joins the substrates together by means of compression bonding while maintaining electroconductive connection therebetween, and said anisotropically electroconductive connecting material 150 can be in the form of a film, liquid or paste, comprising electroconductive particles 170 and 180 dispersed in an insulating adhesive 160.

The electroconductive particles used in the present invention have a modulus of elasticity at the compression bonding temperature of 200% or less, and preferably from 100 to 150%, of the modulus of elasticity of the first substrate at the compression bonding temperature. This enables anisotropically electroconductive connections to be established, even in plastic substrates on which ITO electrodes have been furnished is used as the substrate, without any cracking in the ITO electrodes. An excess of 200% is not preferable because the electroconductive particles shall be deemed to be excessively stiffer than the first substrate, and accordingly when a plastic substrate on which ITO electrodes have been furnished is used as the substrate, the likelihood of cracking in the ITO electrodes during compression bonding is much higher.

As shown in FIG. 1, examples of the first substrate 110 include glass and polyimide substrates, but from the standpoint of the effect of the present invention being particularly evident polycarbonate, polyester sulfone or other plastic substrates are preferable. The second substrate 130 may be of the same material as the first substrate, but it is also possible to use relatively stiffer substrates, in which the modulus of elasticity at the compression bonding temperature is more than 200% of the modulus of elasticity at the compression bonding temperature of the electroconductive particles 170 and 180 (e.g., glass substrates) or relatively more flexible substrates in which the modulus of elasticity is conversely greatly less than 200% of same (e.g., polyimide substrates).

A known cover coat layer may be furnished as needed on the first and second substrates in order to increase the gas barrier property.

Examples of the connecting terminals of the first and second substrate include those comprising copper, aluminium, gold, silver or another metal, or ITO or another oxide. In particular, the effect of the present invention is particularly marked when readily crackable connecting terminals comprising ITO etc. are used.

In the present invention, the modulus of elasticity (KN/mm$^2$) of the substrate shall be defined as the modulus in tension, measured on substrate samples, which have been cut to a specific size (50 μm thick×0.4 mm wide×20 mm long), by a non-resonant forced vibration technique, using a device for measuring viscoelasticity (Orientec K. K.). The modulus of elasticity of the electroconductive particles shall be defined as the load per unit surface area needed to reduce the particle size by 10%, when a load is applied to the electroconductive particles on a glass surface plate using a stainless steel probe. The modulus of elasticity of the substrates and the modulus of elasticity of the electroconductive particles thus defined occupy the same dimension and thus can be used for purposes of comparison.

In order to enhance the post-ageing connection reliability of the anisotropically electroconductive connecting material in the present invention, it is necessary for the electroconductive particles to be able to follow the dimensional changes in the anisotropically electroconductive connection portions. However, raising the modulus of elasticity to too high a level will prompt cracking in the ITO electrodes. Accordingly, electroconductive particles having a modulus of elasticity within a normal temperature range (25° C.) of 4.5 KN/mm$^2$ or less, and preferably of 2.0 KN/mm$^2$ or less, are used.

When the balance between the modulus of elasticity at the compression bonding temperature of the electroconductive particles and the modulus of elasticity in a normal temperature range (25° C.) is taken into consideration, the former preferably comprises 60 to 90% of the latter, and even more preferably 65 to 80% of the latter. Anywhere outside this range will tend to prevent a good connection reliability from being established and as such it is not preferable.

It is preferable for the recovery rate as defined hereunder to be at least 6% and even more preferably at least 30% in order to enhance the post-ageing connection reliability of the anisotropically electroconductive connecting material pertaining to the present invention. If the recovery rate is low, than the electroconductive particles shall not follow the dimensional changes of the anisotropically electroconductive connection portions, and as such it is not preferable.

The recovery rate mentioned in the foregoing shall be defined according to the formula below $$\text{Recovery rate } (R(\%))=(B/A)\times 100$$

in which when the electroconductive particles of particle size A have been deformed by applying a 1 g load, B is the resulting particle size of the electroconductive particles after the load has been removed. In other words, the recovery rate is calculated by applying a 1 g load, using a stainless steel probe, to electroconductive particles of particle size A on a glass surface plate, and the resulting particle size after the load has been removed is taken as B.

In the present invention, as illustrated in FIG. 1, there is no limitation on the material and size of the electroconductive particles 170 and 180, provided that the material used exhibits the modulus of elasticity and recovery rate as described in the foregoing; gold, solder and other metal particles, complex particles comprising a metal-plated resin core and other particles are suitable for application. The size of the particles can be selected as suited to the objective of application, but a size of 3 to 15 μm is normal.

Examples of the insulating adhesive 160 which is used in the anisotropically electroconductive connecting material 150 as shown in FIG. 1 pertaining to the present invention include well-known insulating adhesives such as thermosetting insulating adhesives comprising a polymerisation component such as a solid or liquid epoxy resin and a curing component such as an imidazole-based curing agent or a modified amine-based curing agent, insulating adhesives comprising a polymerisable double bond-containing acrylate resin and a curing catalyst, or rubber-based adhesives comprising acrylic, SBR, SIS, polyurethane or another thermoplastic resin or the like.

The weight ratio of insulating adhesive to electroconductive particles in the anisotropically electroconductive connecting material pertaining to the present invention is 2 to 10 wt pts electroconductive particles per 100 wt pts insulating adhesive.

The anisotropically electroconductive connecting material pertaining to the present invention can be manufactured by combining the insulating adhesive, the electroconductive particles and a solvent in a uniform mixture according to a known method.

The anisotropically electroconductive connecting material pertaining to the present invention may be applied in the configuration of an ACF (anisotropically electroconductive film), wherein it is e.g. applied onto a peel-treated film, and dried to form a film, or an ACP (anisotropically electroconductive paste), in which a paste is applied to the specific sites to be bonded.

The anisotropically electroconductive connecting material pertaining to the present invention is preferably used in the manufacture of liquid crystal panels which use plastic substrates, as has been described in the foregoing; however, besides liquid crystal panels, the material is preferably used when effecting face-down connections of bare IC chips on plastic substrates.

EXAMPLES

The present invention will be described in more detail, based on working examples thereof.

Working Examples 1 to 4 and Comparative Examples 1 to 2

The components displayed in Table 1 were all uniformly mixed according to a known method, and the resulting mixtures were applied onto 50 μm-thick peel-treated polyethylene terephthalate films and dried so that there was no more than 1% residual solvent content, to yield 15 μm-thick anisotropically electroconductive connecting films (ACF). Table 2 displays the moduluses of elasticity (KN/mm$^2$) of the electroconductive particles used in each working and comparative example at 25° C. and at the compression bonding temperature (130° C.) as well as the recovery rate (%) of same, in addition to the ratio (%) of the 130° C. moduluses of elasticity to the 25° C. moduluses of elasticity.

TABLE 1

| Component | wt % |
| --- | --- |
| Epoxyacrylate (3002A; Kyoueisha Kagaku) | 50 |
| Phenoxy resin (YP50; Toto Kasei) | 44 |
| Organic peroxide (Perhexa 3M; Nippon Oils & Fats) | 3 |
| Electroconductive particles | 3 |

The resulting ACFs were sandwiched between plastic substrates (polyether sulfone substrates) on which ITO electrodes had been formed at a pitch of 100 μm and a dual-layer flexible substrate in which 12 μm-thick copper wiring had been formed on a polyimide substrate, subsequent to which a compression bonding process was carried out at 130° C. and 0.1 KN/cm$^2$ for 20 seconds, to yield connected structure assemblies.

The modulus of elasticity for the plastic substrates employed was 2.7 KN/mm$^2$ at 25° C. and 2.4 KN/mm$^2$ at 130° C. The ratios between the moduluses of elasticity of the plastic substrates and the moduluses of elasticity of the electroconductive particles at 130° C. are given in Table 2.

The resulting connected structure assemblies were evaluated against the criteria of "crack occurrence state" of the ITO electrodes, "state of electroconductive particle deformation", "initial resistance value", "post-ageing resistance value" and "state of liquid crystal panel illumination", as described hereunder. The results are displayed in Table 2.

Crack occurrence state

The ITO electrodes on the plastic substrates in the connection portions of the connected structure assemblies were visually assessed using an optical microscope, and the ratios of pins in which cracks appeared per 100 connected pins were obtained.

State of electroconductive particle deformation

The state of electroconductive particle deformation in the connected portions of the connected structure assemblies was observed in the cross-sections of the connected portions, and the degree of particle compression assessed according to the criteria given hereunder.

Rank: Criteria

AA: Particles of 10 μm in diameter had been compressed to a diameter of less than 5 μm.

A: Particles of 10 μm in diameter had been compressed to a diameter of 5 μm or greater but less than 7 μm.

B: Particles of 10 μm in diameter had been compressed to a diameter of 7 μm and greater but less than 9 μm.

C: Particles of 10 μm in diameter had suffered virtually no deformation and a diameter of 9 μm or higher was maintained, or they were not flattened at all.

Initial resistance value

The wiring resistance values of the connected structure assemblies were measured immediately after they had been produced, using a resistance measuring device. Low values revealed that good continuity had been preserved.

Post-ageing resistance value (reliability test)

The connected structure assemblies were left to stand in an environment of 60° C. and 95% RH for 500 hours, after which the wiring resistance values were measured using a resistance value measuring device. Low values revealed that good continuity had been preserved.

State of liquid crystal panel illumination

Liquid crystal panels were finished by using a known method, using the connected structure assemblies, and the state of illumination was assessed by turning the liquid crystal panels on.

TABLE 2

|  | Working Ex. | | | | Comparative Ex. | |
| --- | --- | --- | --- | --- | --- | --- |
| electroconductive particles | 1 | 2 | 3 | 4 | 1 | 2 |
| 25° C. modulus of elasticity a | 1.81 | 4.38 | 3.50 | 3.40 | 5.51 | 10.80 |
| 130° C. modulus of elasticity b | 1.56 | 3.08 | 2.11 | 1.98 | 4.92 | 10.80 |
| (b/a) × 100 (%) | 86 | 70 | 60 | 58 | 89 | 100 |
| Recovery rate (%) | 42 | 48 | 8 | 5 | 32 | 38 |
| (b/2.4$^{*1}$) × 100 (%) (Evaluation) | 65 | 128 | 88 | 83 | 205 | 450 |
| Crack occurrence (%) | 0 | 0 | 0 | 0 | 15 | 80 |
| State of electroconductive particle deformation | AA | A | AA | AA | A | B |
| Initial resistance value (Ω) | 9.8 | 12 | 21 | 21 | — | — |
| Post-ageing resistance value (Ω) | 11.5 | 15 | 85 | 590 | — | — |
| State of liquid crystal panel illumination | Good | Good | Good | No good | — | — |

$^{*1}$modulus of elasticity of plastic substrate at 130° C.

As can be discerned from the results in Table 2, no cracks appeared in the ITO electrodes in the plastic substrates when using the anisotropically electroconductive connecting films prepared in Working Examples 1 to 4, in which the moduluses of elasticity of the electroconductive particles at the compression bonding temperature were 200% or less than the moduluses of elasticity of the plastic substrates at the compression bonding temperature. On the other hand, cracking was evident in the ITO electrodes of the plastic substrates when using the anisotropically electroconductive connecting films pertaining to Comparative Examples 1 and 2, in which the moduluses were higher than 200%.

The post-ageing resistance values increased when using the anisotropically electroconductive connection film pertaining to Working Example 4, in which the modulus of elasticity of the electroconductive particles at the compression bonding temperature fell outside the range of 60 to 90% of the modulus of elasticity of same at 25° C., and a recovery rate of less than 6% was obtained. Accordingly, it is evident that in order to improve the connection reliability of the anisotropically electroconductive connection material, it is preferable to use electroconductive particles which exhibit a modulus of elasticity at the compression bonding temperature within the range of 60 to 90% of the modulus of elasticity of same at 25° C. and also a recovery rate of at least 6%.

According to the anisotropically electroconductive connection material pertaining to the present invention, even when a plastic substrate on which ITO electrodes have been furnished is used as the substrate, neither cracking in the ITO electrodes nor deterioration in post-ageing connection reliability occur, when establishing anisotropically electroconductive connections between mutually opposing substrates.

The disclosures of the specifications, summaries and claims of Japanese Patent Application No. 2000-73026 filed Mar. 15, 2000 and No. 2000-94015 filed on Mar. 30, 2000 are hereby incorporated by references.

What is claimed is:

1. An anisotropically electroconductive connecting material which is disposed between a connection terminal on a first substrate and a connection terminal on a second substrate, and joins the substrates together by thermocompression bonding while maintaining electroconductive connection therebetween, and which comprises electroconductive particles dispersed in an insulating adhesive, wherein the modulus of elasticity of the electroconductive particles at the compression bonding temperature is 200% or less of the modulus of elasticity of the first substrate at the compression bonding temperature.

2. The anisotropically electroconductive connecting material according to claim 1, wherein the first substrate is a plastic substrate and the connection terminal on the first substrate is constituted from ITO (indium-tin-oxide).

3. The anisotropically electroconductive connecting material according to claim 2, wherein the plastic substrate is a polycarbonate or polyether sulfone substrate.

4. The anisotropically electroconductive connecting material according to claim 3, wherein the material is characterized by a recovery rate defined according to the formula below, $$\text{Recovery rate } (R(\%)) = (B/A) \times 100$$

in which when the electroconductive particles of particle size A have been deformed by the application of a 1 g load, B is the resulting particle size of the electroconductive particles after the load has been removed, is at least 6%.

5. The anisotropically electroconductive connecting material according to claim 2, wherein the material is characterized by a recovery rate defined according to the formula below, $$\text{Recovery rate } (R(\%)) = (B/A) \times 100$$

in which when the electroconductive particles of particle size A have been deformed by the application of a 1 g load, B is the resulting particle size of the electroconductive particles after the load has been removed, is at least 6%.

6. The anisotropically electroconductive connecting material according to claim 1, wherein the modulus of elasticity of the electroconductive particles at 25° C. is 4.5 KN/mm² or less.

7. The anisotropically electroconductive connecting material according to claim 6 wherein the material is characterized by a recovery rate defined according to the formula below, $$\text{Recovery rate } (R(\%)) = (B/A) \times 100$$

in which when the electroconductive particles of particle size A have been deformed by the application of a 1 g load, B is the resulting particle size of the electroconductive particles after the load has been removed, is at least 6%.

8. The anisotropically electroconductive connecting material according to claim 1, wherein the modulus of elasticity of the electroconductive particles at the compression bonding temperature is 60 to 90% of the modulus of elasticity of same at 25° C.

9. The anisotropically electroconductive connecting material according to claim 6, wherein the material is characterized by a recovery rate defined according to the formula below, $$\text{Recovery rate } (R(\%)) = (B/A) \times 100$$

in which when the electroconductive particles of particle size A have been deformed by the application of a 1 g load, B is the resulting particle size of the electroconductive particles after the load has been removed, is at least 6%.

10. The anisotropically electroconductive connecting material according to claim 1, wherein the material is characterized by a recovery rate defined according to the formula below, $$\text{Recovery rate } (R(\%)) = (B/A) \times 100$$

in which when the electroconductive particles of particle size A have been deformed by the application of a 1 g load, B is the resulting particle size of the electroconductive particles after the load has been removed, is at least 6%.

* * * * *